United States Patent
Lee

(10) Patent No.: US 8,026,139 B2
(45) Date of Patent: Sep. 27, 2011

(54) METHOD OF FABRICATING A NON-VOLATILE MEMORY DEVICE

(75) Inventor: In No Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 292 days.

(21) Appl. No.: 11/962,058

(22) Filed: Dec. 20, 2007

(65) Prior Publication Data

US 2008/0220578 A1   Sep. 11, 2008

(30) Foreign Application Priority Data

Mar. 6, 2007   (KR) .................. 10-2007-0021776

(51) Int. Cl.
*H01L 21/336*   (2006.01)

(52) U.S. Cl. .. 438/257; 438/201; 438/593; 257/E21.179

(58) Field of Classification Search .................. 438/201, 438/211, 257, 593; 257/E21.179, E21.422
See application file for complete search history.

(56) References Cited

U.S. PATENT DOCUMENTS

| | | | | |
|---|---|---|---|---|
| 6,287,907 | B1 * | 9/2001 | Ito et al. ......................... | 438/201 |
| 2001/0001732 | A1 * | 5/2001 | Mitsuiki ......................... | 438/689 |
| 2003/0216001 | A1 * | 11/2003 | Lee et al. ........................ | 438/258 |
| 2005/0095784 | A1 * | 5/2005 | Yang .............................. | 438/257 |

FOREIGN PATENT DOCUMENTS

| | | |
|---|---|---|
| KR | 1020010055526 A | 7/2001 |
| KR | 1020060005180 A | 1/2006 |
| KR | 1020060023489 A | 3/2006 |
| KR | 1020060078439 A | 7/2006 |

* cited by examiner

*Primary Examiner* — Thanhha Pham
(74) *Attorney, Agent, or Firm* — Kilpatrick Townsend & Stockton LLP

(57) ABSTRACT

In a method of fabricating a non-volatile memory device, a semiconductor substrate includes an isolation layer formed in an isolation region, a tunnel insulating layer and a first conductive layer for a floating gate formed in an active region, and a dielectric layer, a second conductive layer for a control gate, and a gate hard mask formed over the first conductive layer including the isolation layer. The second conductive layer is patterned using the gate hard mask as an etch mask. The dielectric layer is patterned so that the first conductive layer, which is exposed as the dielectric layer is etched, is also etched. The first conductive layer is patterned along a pattern of the gate hard mask. Accordingly, at the time of gate patterning, micro bridges between the floating gates can be prevented and a 2-bit failure between neighboring cells is less likely.

13 Claims, 5 Drawing Sheets

METHOD OF FABRICATING A NON-VOLATILE MEMORY DEVICE

CROSS-REFERENCES TO RELATED APPLICATIONS

The present application claims priority to Korean patent application number 10-2007-21776 filed on Mar. 6, 2007, which is incorporated by reference in its entirety.

BACKGROUND OF THE INVENTION

The present invention relates to a method of fabricating non-volatile memory devices and, more particularly, to a method of fabricating a non-volatile memory device, which can prevent the formation of micro bridges between floating gates at the time of gate patterning.

In order to form the gate of a non-volatile memory device, a tunnel insulating layer and a first polysilicon layer for a floating gate are laminated over a semiconductor substrate. A trench is formed in an isolation region while patterning the first polysilicon layer and the tunnel insulating layer through an isolation process of self-aligned shallow trench isolation (SA-STI). The trench is gap-filled with an insulating material to form an isolation layer. A dielectric layer of an oxide-nitride-oxide (ONO) stack structure, a second polysilicon layer for a control gate, and a hard mask are sequentially laminated over the patterned first polysilicon layer and the isolation layer. The hard mask is etched using a photoresist pattern to cross the isolation layer. The second polysilicon layer, the ONO dielectric layer, and the patterned first polysilicon layer are patterned using the etched hard mask, thus forming a gate comprised of the tunnel insulating layer, the floating gate, the dielectric layer, and the control gate.

However, in the gate formation process, the first polysilicon layer is not fully removed. Minute poly residue remains causing the formation of a micro bridge between the floating gates. In particular, micro bridges are generated near the ONO dielectric layer, which remains after the last gate etching. This phenomenon becomes increasingly problematic when the height of the remaining dielectric layer is high.

In order to solve the above problem, a target etching thickness of the ONO dielectric layer can be increased. If a target etching thickness of the dielectric layer is increased, however, an attack margin of an active region decreases. The micro bridges result in a 2-bit failure, which makes it impossible to discriminate information between neighboring cells, thereby degrading product yield.

BRIEF SUMMARY OF THE INVENTION

The present invention is directed to a method of fabricating a non-volatile memory device, which can improve a 2-bit failure between neighboring cells by preventing the formation of micro bridges between floating gates at the time of gate etching.

In one embodiment, a method of fabricating a non-volatile memory device includes providing a semiconductor substrate in which an isolation layer is formed in an isolation region. A tunnel insulating layer and a first conductive layer for a floating gate are formed in an active region. A dielectric layer, a second conductive layer for a control gate, and a gate hard mask are formed over the first conductive layer including the isolation layer. The second conductive layer is patterned using the gate hard mask as an etch mask. The dielectric layer is patterned so that the first conductive layer, which is exposed as the dielectric layer is etched, is also etched. The first conductive layer is patterned using the gate hard mask as an etch mask.

The first conductive layer may be formed of a polysilicon layer to a thickness of 300 to 2000 angstroms. The dielectric layer may have a stack structure of an oxide-nitride-oxide (ONO) layer.

The dielectric layer may be patterned in a process state where a selection ratio of the ONO layer to the polysilicon layer is set to 1:1 to 3:1, and a source power is set from 0 to 300 W and a bias power is set from 100 to 500 W. The dielectric layer may be patterned at a pressure of 3 to 15 mTorr using an etch gas of $CF_4$/He or $CF_4$/Ar so that the dielectric layer is isotropically etched. In the patterning of the dielectric layer, the dielectric layer having a height of 100 to 300 angstroms and a thickness of 50 to 150 angstroms may remain on sidewalls of the first conductive layer. In the patterning of the dielectric layer, the dielectric layer may be also etched to a thickness corresponding to ½ to ⅘ of a thickness of the first conductive layer.

The remaining first conductive layer may be patterned so that the polysilicon layer has an etch selectivity of 50:1 to 150:1 with respect to the ONO layer. The remaining first conductive layer may be patterned at a pressure of 10 to 50 mTorr using a reaction gas of $HBr/O_2$ with a ratio of a source power versus a bias power being set from 1:1 to 2:1. At the time of patterning of the remaining first conductive layer, a height of the remaining ONO layer may be set not to exceed 200 angstroms.

DESCRIPTION OF SPECIFIC EMBODIMENTS

A specific embodiment according to the present invention will be described with reference to the accompanying drawings.

Figure 1:
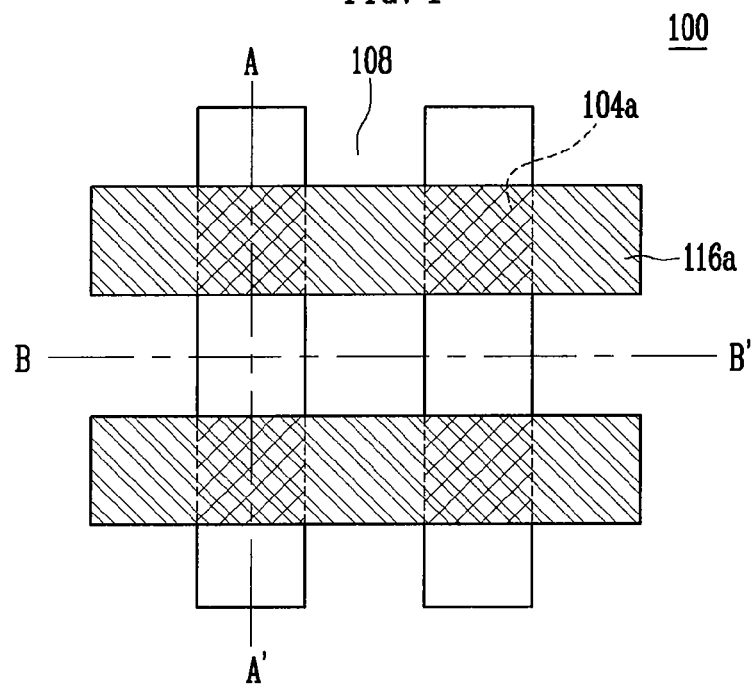
FIG. 1 is a layout diagram after gate etching a non-volatile memory device according to the present invention.

FIG. 1 is a layout diagram after gate etching a non-volatile memory device according to the present invention. FIGS. 2A to 2E are cross-sectional views illustrating a gate etching process of the non-volatile memory device taken along line A-A' of FIG. 1. FIGS. 3A to 3E are cross-sectional views illustrating a gate etching process of the non-volatile memory device taken along line B-B' of FIG. 1.

Referring to FIG. 1, a plurality of floating gates 104a, which are spaced apart from one another at predetermined intervals, are formed in an active region of a semiconductor substrate 100. Isolation layers 108 are formed in an isolation region. Control gates 116a crossing the isolation layers 108 are formed over the floating gates 104a and the isolation layers 108. The floating gates 104a and the control gates 116a are isolated by a dielectric layer. A method of fabricating the non-volatile memory device is described below.

Figure 2A:
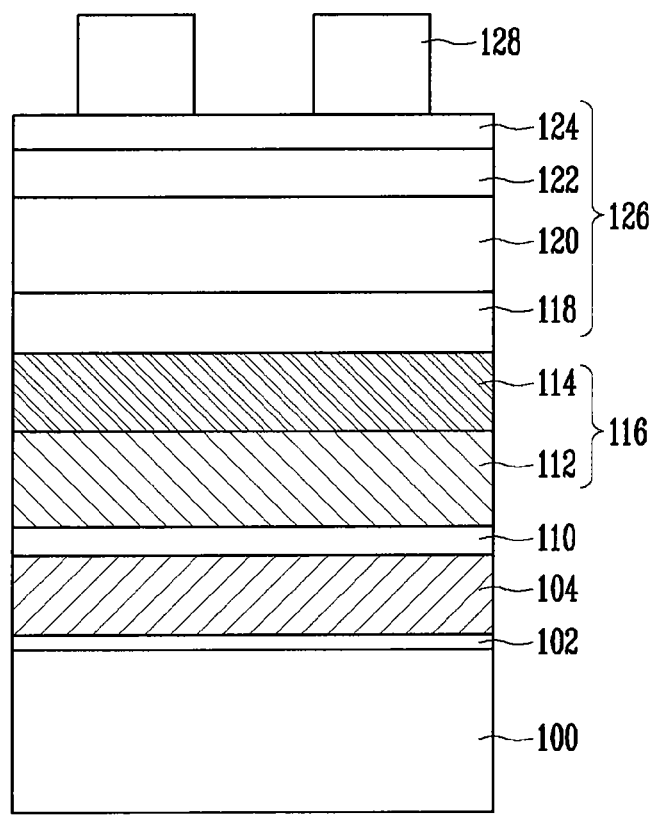
FIGS. 2A to 2E are cross-sectional views illustrating a gate etching process of the non-volatile memory device taken along line A-A' of FIG. 1.
Figure 3A:
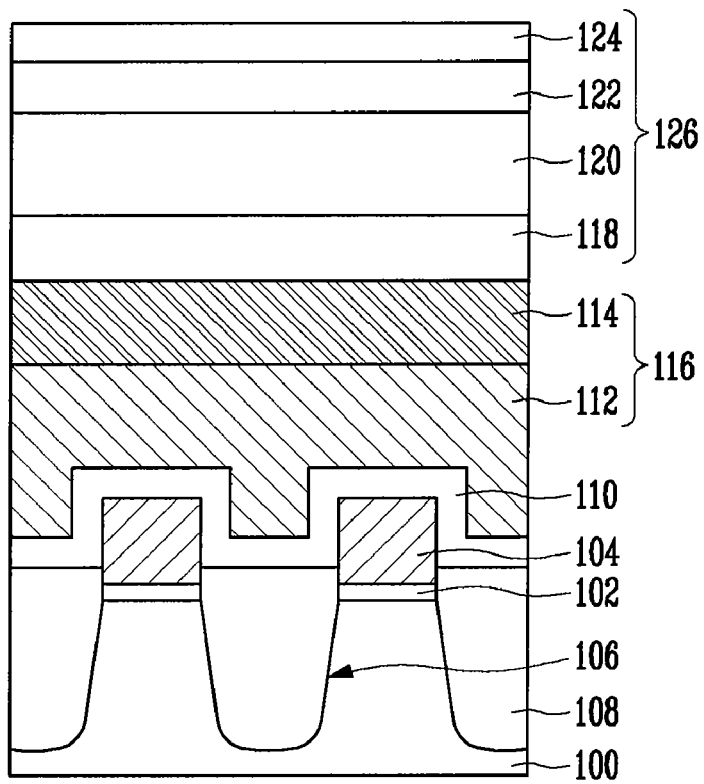
FIGS. 3A to 3E are cross-sectional views illustrating a gate etching process of the non-volatile memory device taken along line B-B' of FIG. 1.

Referring to FIGS. 2A and 3A, the semiconductor substrate 100 includes the isolation layers 108 that are formed in the isolation region. A tunnel insulating layer 102 and a first conductive layer 104 for a floating gate are formed in the active region. A dielectric layer 110, a second conductive layer 116 for a control gate, and a gate hard mask 126 are formed over the first conductive layer 104 including the isolation layer 108. In more detail, the tunnel insulating layer 102, the first conductive layer 104, and the hard mask (not shown) are sequentially laminated over the semiconductor substrate 100. The isolation region of the hard mask, the first conductive layer 104, and the tunnel insulating layer 102 is etched using a photoresist pattern (not shown) formed in the isolation region. The isolation region of the semiconductor substrate 100 is etched to form a trench 106. The trench 106 may be formed using an advanced self-aligned shallow trench isolation (ASA-STI) process of implementing the first conductive layer 104 and the trench 106 at the same time. The photoresist pattern is formed by coating a photoresist on the hard mask, forming a photoresist layer, and then performing exposure and development employing a mask. The photoresist pattern is then removed. An insulating material including the trench 106 is deposited on the hard mask, thus forming an insulating layer (not shown) that gap-fills the trench 106. The insulating layer is polished until the surface of the hard mask is exposed. In order to control an effective field oxide height (EFH), the insulating layer is etched so that the outer walls of the first conductive layer 104 are exposed. The hard mask is then removed. Accordingly, the tunnel oxide layer 102 and the first conductive layer 104 are formed in the active region. The isolation layer 108 to gap-fill the trench 106 is formed within the trench 106 of the isolation region.

The tunnel insulating layer 102 may be formed using silicon oxide ($SiO_2$) in an oxidation process. The first conductive layer 104 forms the floating gate of an inactive memory device, and may be formed using a polysilicon layer. The first conductive layer 104 may be formed to a thickness of 300 to 2000 angstroms. The hard mask may have a stack layer including a buffer oxide layer and a silicon nitride layer.

A dielectric layer 110, a second conductive layer 116, and a gate hard mask 126 are formed over the first conductive layer 104 including the isolation layer 108. The dielectric layer 110 may have a stack structure of ONO. The second conductive layer 116 may have a stack layer of a polysilicon layer, a metal layer, a polysilicon layer, and a metal layer, or a stack layer of a polysilicon layer and a metal silicide layer. The second conductive layer 116 may be formed using a polysilicon layer. In one embodiment, the second conductive layer 116 may have a stack layer including a polysilicon layer 112 and a metal silicide layer 114. After the second conductive layer 116 is formed, the second conductive layer 116 is polished using an etch-back process. The gate hard mask 126 may have a stack structure of an oxide layer 118 for a hard mask, an amorphous carbon layer 120, a silicon oxynitride (SiNO) layer 122, and an anti-reflective coating (ARC) layer 124. Photoresist patterns 128 are formed on the ARC layer 124. The photoresist patterns 128 intersect the isolation layer 108 and are spaced apart from one another at predetermined intervals.

Figure 2B:
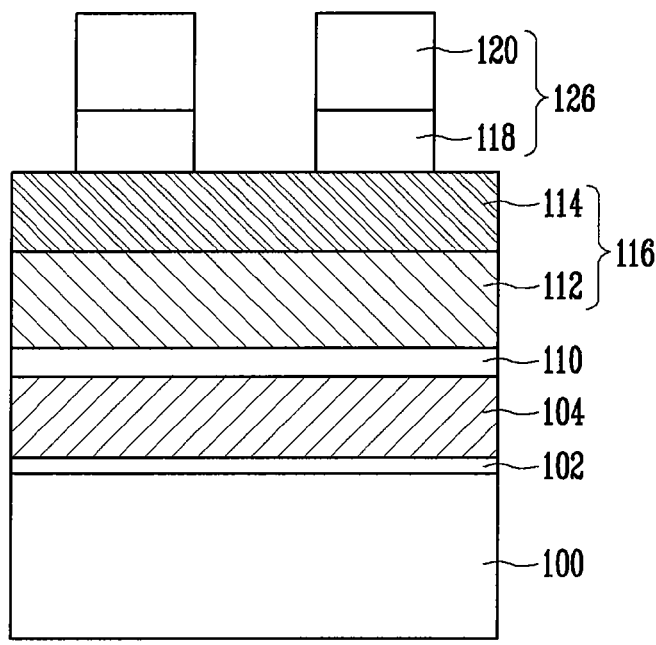
Figure 3B:
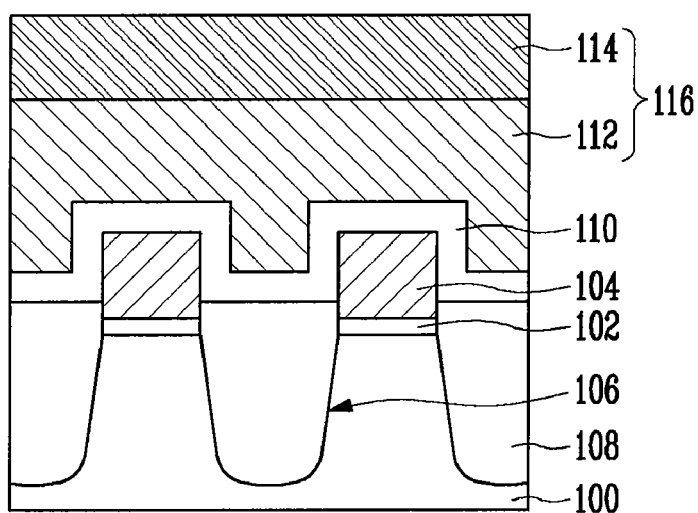

Referring to FIGS. 2B and 3B, the ARC layer 124 and the silicon oxynitride layer 122 of the gate hard mask 126 are patterned by an etch process employing the photoresist patterns 128. The photoresist patterns 128 are then removed. The amorphous carbon layer 120 and the oxide layer 118 are patterned using the patterned ARC layer 124 and the patterned silicon oxynitride layer 122 as an etch mask. In this process, the ARC layer 124 and the silicon oxynitride layer 122 may be removed. Alternatively, the ARC layer 124 and the silicon oxynitride layer 122 may be removed by an etch process. In this case, the surface of the metal suicide layer 114 of the second conductive layer 116 is exposed in regions where the patterned gate hard masks 126 are not formed.

Figure 2C:
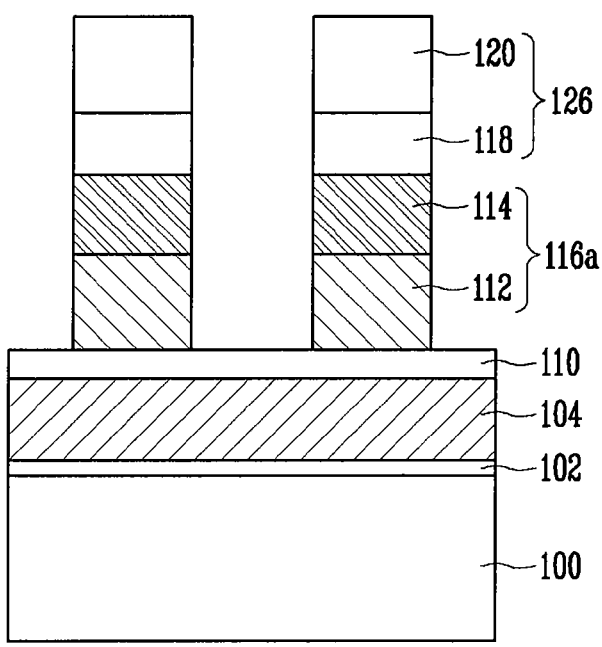
Figure 3C:
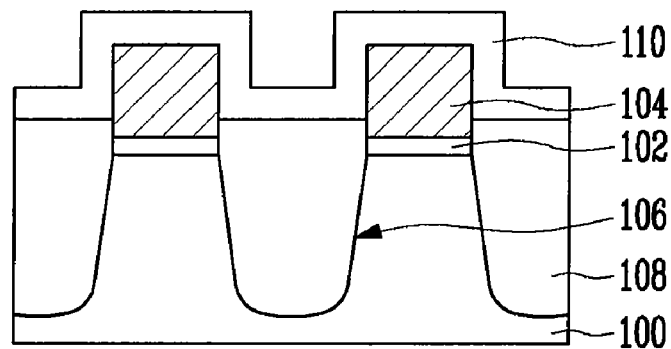

Referring to FIGS. 2C and 3C, the second conductive layer 116 is patterned using the patterned amorphous carbon layer 120 and the patterned oxide layer 118 as an etch mask. Accordingly, a control gate 116a comprised of the second conductive layer 116 is formed, and the second conductive layer 116 of a region where the gate hard mask 126 is not formed is removed, so that the surface of the dielectric layer 110 is exposed.

Figure 2D:
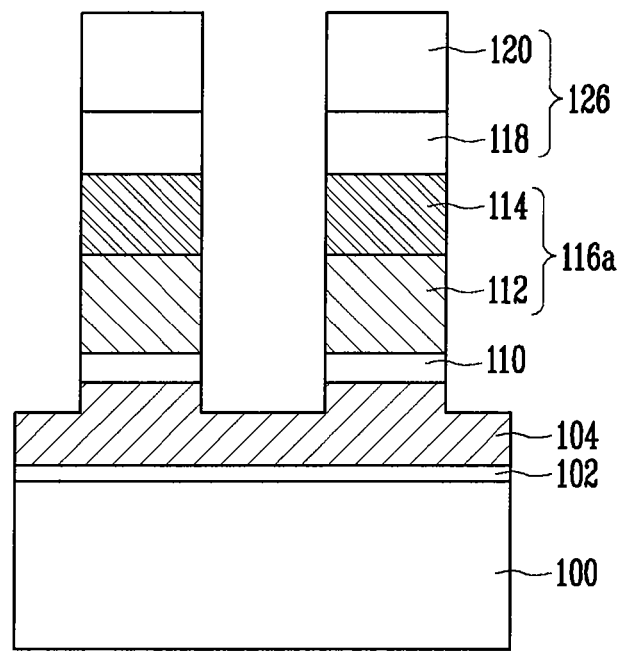
Figure 3D:
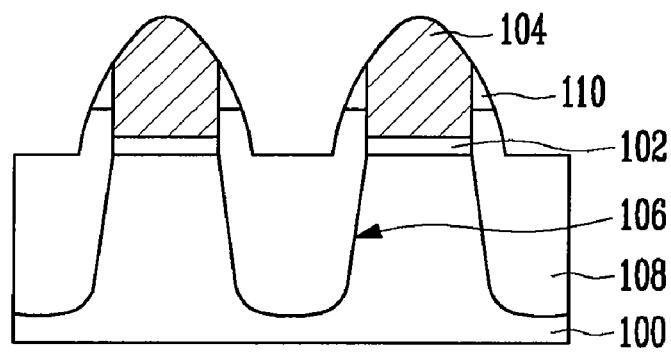

Referring to FIGS. 2D and 3D, the dielectric layer 110 is patterned such that the first conductive layer 104, which is exposed as the dielectric layer 110 is etched using the gate hard mask 126 and the control gate 116a as an etch mask, is also etched to a thickness of ½ to ⅘ of the first conductive layer 104.

The dielectric layer 110 may be etched using a dry etch process. The dry etch process is performed under a process condition in which an etch rate with respect to the ONO layer of the dielectric layer 110 is faster than the etch rate with respect to the polysilicon layer of the first conductive layer 104, and an isotropic etch characteristic is strong.

In more detail, when etching the ONO dielectric layer 110, a source power is set low and a bias power is set high so that the etch selectivity ratio of the ONO layer to the polysilicon layer ranges from 1:1 to 3:1 and the etch rate with respect to the ONO layer is faster than the etch rate with respect to the polysilicon layer. The source power may range from 0 to 300 W and the bias power may range from 100 to 500 W. While etching the ONO dielectric layer 110, in order to enhance the isotropic etch characteristic, an etch gas, such as $CF_4$/He or $CF_4$/Ar, may be used at a lower pressure of 3 to 15 mTorr.

Accordingly, since the selection ratio of the ONO layer to the polysilicon layer may be approximately 1:1 to 3:1, the ONO dielectric layer 110 and the first conductive layer 104 of the polysilicon layer can be etched at the same time. In particular, the ONO dielectric layer 110 is etched horizontally and vertically as shown in FIG. 3D. Consequently, the first conductive layer 104 is etched such that a portion of the polysilicon layer is removed and edges of the first conductive layer 104 become inclined. Furthermore, the dielectric layer 110 having a low height and a small thickness remains on the sidewalls of the first conductive layer 104.

It is preferred that the dielectric layer 110 be fully removed. However, if the dielectric layer 110 is not fully removed, the height of the remaining dielectric layer 110 is set to 100 to 300 angstroms and the thickness thereof is set to 50 to 150 angstroms. Thus, poly residue can be easily removed while protecting the active region at the boundary surface of the isolation layer 108 in a subsequent process of etching the first conductive layer 104.

As described above, the height of the dielectric layer 110 is lowered and the thickness of the dielectric layer 110 on the sidewalls of the first conductive layer 104 is small. Accordingly, in a subsequent etching process of the first conductive layer 104, a profile, which is advantageous to remove poly residue, can be formed and the elimination of micro bridges can be improved.

Furthermore, the thickness of the dielectric layer 110 is lowered although the dielectric layer 110 is etched less even though the etch selectivity of the ONO layer is higher than that of the polysilicon layer in a subsequent etch process of the first conductive layer 104.

Figure 2E:
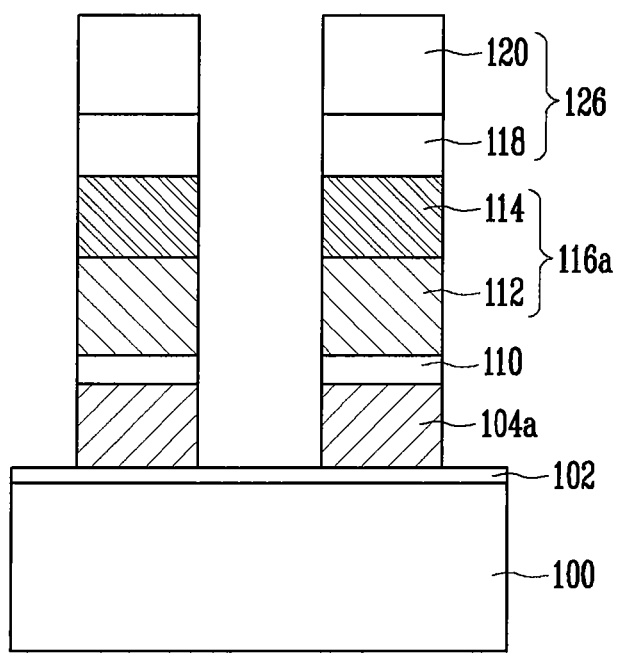
Figure 3E:
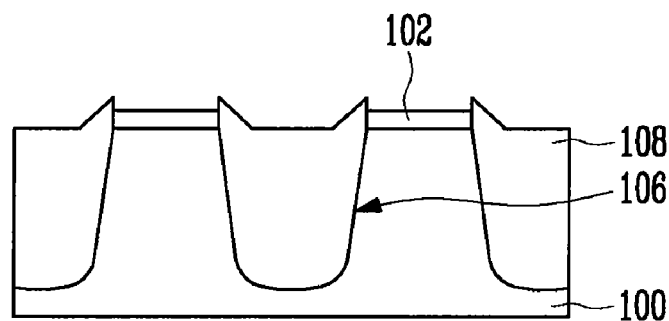

Referring to FIGS. 2E and 3E, the first conductive layer 104 is patterned using the etched oxide layer 118 of the gate hard mask 126, the control gate 116a, and the etched dielectric layer 110 as an etch mask.

While etching of the first conductive layer 104, the etch selectivity of the polysilicon layer may be set from 50:1 to 150:1, which is higher than that of the ONO layer. The first conductive layer 104 may be etched using a reaction gas, such as $HBr/O_2$, in a process state where the ratio of the source power to the bias power is lowered (e.g., 1:1 to 2:1) at an intermediate pressure of 10 to 50 mTorr. After the first conductive layer 104 is etched, the height of the remaining dielectric layer 110 is set not to exceed 200 angstroms.

Accordingly, as shown in FIG. 2E, the first conductive layer 104 is patterned, so that the floating gate 104a having a vertical profile is formed. Consequently, a gate (not shown), in which the tunnel insulating layer 102, the floating gates 104a comprised of the first conductive layer 104, the dielectric layer 110, and the control gate 116 comprised of the second conductive layer 116 are laminated, is formed in the region where the gate hard mask 126 is formed.

The polysilicon layer up to the area of the isolation layer 108 is removed in the region where the oxide layer 118 of the gate hard mask 126 is not formed. Accordingly, the elimination of micro bridges caused by poly residue between the floating gates 104a can be improved and, therefore, a 2-bit failure between neighboring cells is less likely, so that product yield can be improved.

Furthermore, the second conductive layer 116, the dielectric layer 110, and the first conductive layer 104 can be etched in-situ in inductive coupling plasma (ICP) equipment at the time of gate etching.

The present invention can be applied to the fabrication of non-volatile memory devices, and other semiconductor fabrication having a similar structure.

According to the present invention, upon patterning of an ONO dielectric layer in a gate patterning process, an etch rate with respect to the ONO dielectric layer is set to be faster than that of a polysilicon layer, and the ONO dielectric layer undergoes isotropic etching. Thus, the thickness of the remaining dielectric layer on the sidewalls of a conductive layer for a floating gate is reduced while lowering the height of the remaining dielectric layer. Accordingly, poly residue can be removed easily when subsequently patterning the conductive layer for the remaining floating gate. Consequently, the elimination of micro bridges between the floating gates can be improved, a 2-bit failure between neighboring cells is less likely, and product yield can be improved.

Although the foregoing description has been made with reference to specific embodiments, it is to be understood that changes and modifications of the present invention may be made by one having ordinary skill in the art without departing from the spirit and scope of the present invention and the appended claims.

What is claimed is:

1. A method of fabricating a non-volatile memory device, the method comprising:

forming an isolation layer in an isolation region of a semiconductor substrate;

forming a tunnel insulating layer and a first conductive layer for a floating gate in an active region of the semiconductor substrate;

forming a dielectric layer, a second conductive layer for a control gate, and a gate hard mask over the first conductive layer and the isolation layer;

patterning the second conductive layer using the gate hard mask as an etch mask;

patterning the dielectric layer so that the first conductive layer is etched, thereby reducing a height and a thickness of the dielectric layer remaining on sidewalls of the first conductive layer with the height of the dielectric layer remaining on the sidewalls of the first conductive layer being lower than a height of the sidewalls of the first conductive layer, wherein an etch rate of the dielectric layer is higher than an etch rate of the first conductive layer when the patterning the dielectric layer is performed; and patterning the first conductive layer using the gate hard mask as an etch mask.

2. The method of claim 1, wherein the first conductive layer is a polysilicon layer.

3. The method of claim 2, wherein the polysilicon layer is formed to a thickness of approximately 300 to 2000 angstroms.

4. The method of claim 1, wherein the dielectric layer has a stack structure comprising an oxide-nitride-oxide (ONO) layer.

5. The method of claim 1, wherein the first conductive layer is a polysilicon layer and the dielectric layer has a stack structure comprising an oxide-nitride-oxide (ONO) layer, an etching selection ratio of the ONO layer to the polysilicon layer being approximately 1:1 to 3:1 during said step of patterning the dielectric layer.

6. The method of claim 5, wherein the dielectric layer is patterned using a source power of 0 to 300 W and a bias power of 100 to 500 W.

7. The method of claim 4, wherein the dielectric layer is patterned so that the dielectric layer is isotropically etched.

8. The method of claim 7, wherein the dielectric layer is patterned at a pressure of 3 to 15 mTorr using an etch gas of $CF_4$/He or $CF_4$/Ar.

9. The method of claim 5, wherein patterning the dielectric layer is performed such that the dielectric layer having a height of approximately 100 to 300 angstroms and a thickness of approximately 50 to 150 angstroms remains on sidewalls of the first conductive layer.

10. The method of claim 1, wherein patterning the dielectric layer is performed such that the dielectric layer is etched to a thickness corresponding to approximately ½ to ⅘ of a thickness of the first conductive layer.

11. The method of claim 1, wherein the first conductive layer is a polysilicon layer and the dielectric layer has a stack structure comprising an oxide-nitride-oxide (ONO) layer, the first conductive layer being patterned so that the polysilicon layer has an etch selectivity of approximately 50:1 to 150:1 with respect to the ONO layer.

12. The method of claim 11, wherein the first conductive layer is patterned at a pressure of 10 to 50 mTorr using a reaction gas of $HBr/O_2$ with a ratio of a source power to a bias power being set to approximately 1:1 to 2:1.

13. The method of claim 12, wherein when patterning the first conductive layer, a height of the remaining ONO layer is set not to exceed 200 angstroms.

* * * * *